METHOD OF FORMING FACE-BONDING PROJECTIONS

Filed Jan. 15, 1968

INVENTORS
JOHN W. SLEMMONS
ANTHONY J. DOMINICK
BY Wallace B. King
AGENT

United States Patent Office 3,531,852
Patented Oct. 6, 1970

3,531,852
METHOD OF FORMING FACE-BONDING PROJECTIONS

John W. Slemmons, Orange, and Anthony J. Dominick, Jr., Buena Park, Calif., assignors to North American Rockwell Corporation Filed Jan. 15, 1968, Ser. No. 697,840
Int. Cl. B23k *21/00*
U.S. Cl. 29—470.1 15 Claims

ABSTRACT OF THE DISCLOSURE

Method of forming face-bonding projections upon semiconductor chips or substrates for use in face-bonded hybrid microcircuits, including the steps of placing a chip or substrate upon a bonding apparatus having a concave tool; covering the die with a sheet of metal foil; bringing the concave tool into contact with the foil surface at the area adjacent to a conductor pad on the chip; and applying energy to said tool to form and bond a projected portion of the metal foil to the conductor pad.

BACKGROUND OF THE INVENTION

Field of the invention

The invention relates to a method for providing face bondable semiconductor chips, and more particularly to a method for forming face-bonding projections upon the conducting pads associated with the semiconductor chips.

Description of the prior art

Early attempts to face bond integrated circuits to thin film substrates involved the direct bonding of the circuits' thin-film terminals to conductors formed on the thin film substrate. Because the bonds could not be inspected to determine their effectiveness or strength, this method proved inadequate for the manufacture of highly reliable microelectronic devices. By raising the integrated circuit chip or die above the substrate, using a relatively thick bonding pad, the bonds became more visible.

One method of forming thick bonding pads involves the coating of silicon wafers (comprising a plurality of chips) with glass, etching holes in the glass to expose the circuit terminals, coating the holes with solder, and fusing balls into the holes by heating the solder. The chips or dice are then bonded to the substrate by heating a solder coating on the substrates' conductors.

Other methods for providing projections at the terminals of integrated circuit chips or dice utilize an etching or a plating process. These methods involve expensive processes which provide inferior and unreliable face-bonding projections that are very nonuniform as to size, composition and texture.

These prior art methods all include the projection forming process as a part of the manufacturing processes which result in the integrated circuit chip itself. Such methods are not feasible where it is necessary or desirable to add the face-bonding projections to a chip or die after the integrated circuit is completed. Where hybrid thin-film microcircuits are assembled from integrated circuit components from a variety of manufacturing sources, reliability and efficiency are greatly enhanced where the face-bonding projections are separately and uniformly applied to the circuit components by the same process. The system manufacturer, using integrated circuit chips with mounted face-bonding projections from several different manufacturers, would have to adjust the face-bonding techniques used in the assembly of thin-film microcircuits systems in order to accommodate each of the projections used by the various manufacturers.

The present invention bonds the face-bonding projections to the conducting pads of the completed integrated circuit chip, or of the substrate, thus affording uniformity of projections no matter how great the variety of integrated chips used in the assembly of an hybrid thin-film microcircuit.

SUMMARY OF THE INVENTION

In accordance with the present invention there is set forth a method of forming face-bonding projections onto the conductor pads of integrated circuit chips or dice. The technique is also adaptable to alternatively bonding the projections to the conductor pads situated on a substrate leaving a mirror image conductor pattern with respect to the chips to be subsequently bonded thereto. The present method comprises the steps of placing a chip, or wafer containing a plurality of chips, upon the anvil of a bonding apparatus having a concave shaped tool mounted thereon; covering the wafer or chip with a sheet of metal foil; bringing the concave tool in contact with the surface of the foil at the area adjacent to a conductor pad located on the chip or one of the chips forming the wafer; applying energy to the tool to form and bond a cone shaped projection of the metal foil to the conductor pad.

The present invention also provides a method for easily forming face-bonding projections consisting of two or more layers of differing metals. By utilizing multiple-layer metal foil, face-bonding projections can be precisely formed to comply with a diversity of bonding requirements and specifications.

An object of the present invention is to provide an improved method for forming and bonding face-bonding projections to the conductor pads of integrated circuit chips, or of substrates.

Another object of this invention is to provide a method for forming and bonding face-bonding projections to the conductor pads of integrated circuit chips, wherein said projections have precisely uniform characteristics of size, shape, density and composition.

DESCRIPTION OF THE PREFERRED EMBODIMENTS

Figure 1:
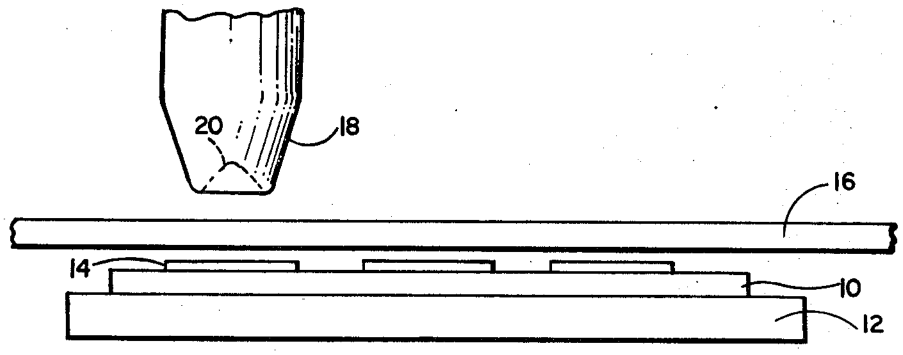
FIG. 1 is a schematic representation showing the location and orientation of an integrated circuit chip, a foil strip of conductive metal, and a conical tool for performing the present inventive method in a preferred manner.

Referring now to FIG. 1, there is schematically represented an integrated circuit chip 10 situated upon a stationary base 12, which may be the anvil of an ultrasonic or other type bonding apparatus. The integrated circuit chip 10 contains a plurality of conductor pads 14, which pads 14 are here shown slightly raised above the surface of the chip 10. A strip of metal foil 16 is shown situated above and covering the integrated circuit chip 10.

A bonding tool 18, which is attached to a bonding apparatus, not here shown, is shown in a position above the metal foil strip 16.

The tip 20 of the tool 18 has a substantially conical concave form. In order to form a face-bonding projection on a conductor pad 14, the concave tool 18 must be directly centered above the pad 14, as shown.

The concave tool is brought into contact with the metal foil at the area adjacent to a predetermined area of said workpiece.

To proceed in accordance with present method, the concave tool 18 is placed in contact with the metal foil 16, with sufficient pressure to depress the lower extremity of the tool to substantially contact a conductor pad 14. The metal foil may consist of a variety of soft conductive metals, as for example, aluminum, indium, solder, silver, or gold. With the concave tool 18, pressed against the metal foil 16 and the conductor pad 14, a source of energy, not here shown, is applied thereto and that portion of the metal strip 16 within the depression 20 of the tool 18 is bonded to the conductor pad 14.

Figure 2:
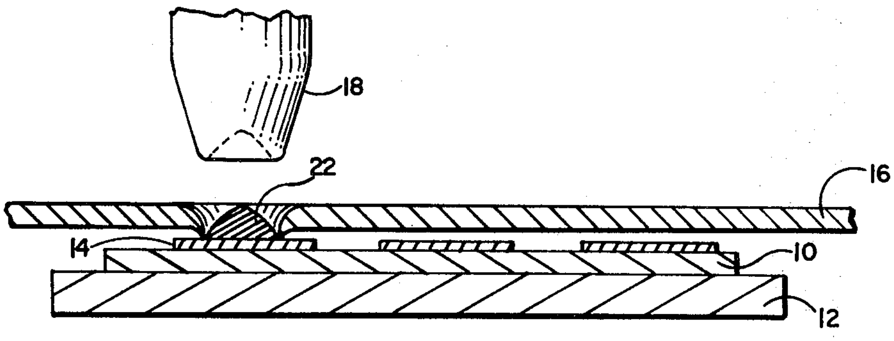
FIG. 2 is a cross-sectional view of FIG. 1 and shows a subsequently formed face-bonding projection which is bonded to a conductor pad of the integrated circuit chip.

FIG. 2 is a cross-sectional schematic representation of a face-bonding projection 22 which has been formed by the concave tool 18 and bonded to the conductor pad 14 by the above-described method. The process is then duplicated after recentering the concave tool over another conductor pad until face-bonding projections are bonded to each pad of the integrated circuit chip 10.

Using the present process in a preferred manner, the energy applied to the conical tool for bonding the projection of metal foil to the conductor pad may be ultrasonic energy, or it may be thermal energy vibrational energy. The vibrational energy may have a frequency range between 60 and 400,000 cycles per second. The use of ultrasonic energy for bonding allows a somewhat more rapid operation than that possible through the use of heat. Also, the use of ultrasonic energy for bonding of the projections to an integrated circuit eliminates any risk of heat damage to such circuit.

Figure 3:
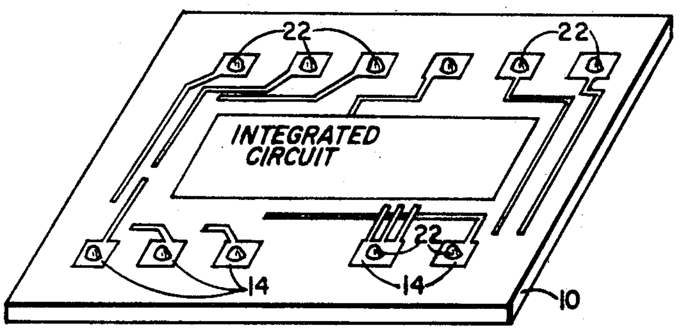
FIG. 3 depicts an integrated circuit chip having face-bonding projections bonded to the conductor pads by the method of the present invention.

FIG. 3 shows a representation of an integrated circuit chip 10 having a plurality of conductor pads 14 formed thereon. Upon each pad 14, there is shown a face-bonding projection 22 formed by the method of the present invention. The present method of applying face-bonding projections can be applied to any integrated circuit chip produced by any of a variety of manufacturers. The process provides uniform projections which have the same shape, size and composition. This high degree of uniformity is conducive to high reliability in the fabrication of hybrid thin film microcircuit systems.

It should be noted that the inventive process described herein is not limited to forming and bonding face-bonding projections onto integrated circuit chips. Under some circumstances it may be desirable to form the projections upon the conductor pads of the substrate structure. The substrate would contain a mirror image conductor pattern to which the chips would subsequently be bonded after the projections are formed on the substrate.

Figure 4:
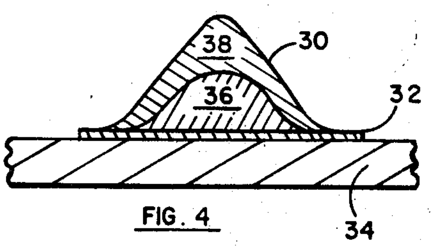
FIG. 4 is a schematic cross-sectional representation of a face-bonding projection formed from a metal foil comprising two layers of conductive metals which have differing deformation characteristics.

Referring to FIG. 4, there is shown an enlarged representation of a face-bonding projection 30 upon a conductor pad 32 of an integrated circuit chip 34. Here, the projection is formed from a metal foil comprising two layers of different conductive metals. The lower portion 36 of the projection 30 may consist of a metal like aluminum which deforms to a substantially lesser degree than the metal, for example indium, which comprises the upper half 38 of the projection 30. Where thermal energy is applied to the foil, the lower portion 36 may consist of solder having a relatively high temperature melting point, while the upper portion 38 may consist of solder having a relatively low temperature melting point.

By forming face-bonding projections using metal foil comprising a combination of conductive metals, the amount of deformation which the face-bonding projection will undergo, when subsequently bonded to a thin film substrate, is controllable within close limits.

When the integrated chip 34 is bonded to the thin film substrate, the malleable metal represented by the upper portion 38 will be deformed and form the bond to the substrate conductor. In the event that the tips of the face-bonding projections do not form a uniform plane, for whatever reason, the variations are compensated for when the chip is bonded to the thin film substrate and the upper metal is deformed. Using a somewhat harder conductive metal for the base 36 of the face-bonding projection 30, assures that the integrated chip 34 will be maintained at a minimum distance from the thin film substrate. It is obvious that when the circumstances require it, any practical number of metal layers could be used to form the face-bonding projection.

The inventive process as described thus fas has shown the use of a metal foil for providing metal at the tip of the concave tool 18, in FIG. 1. It should be understood that other means would be available to situate a proper quantity of metal adjacent to a conductor pad of a chip or substrate. One such means would be to pass a metal wire through a hole in the concave tip of the tool 18, and with a flame form a sphere at the end of such wire before forming and bonding a projection onto a conductor pad.

Although the invention has been described in detail, it is to be understood that the same is by way of illustration and example only, and is not to be taken by way of limitation, the spirit and scope of this invention being limited only by the terms of the appended claims.

What is claimed is:

1. A method of forming and attaching at least one projection to a surface of a workpiece comprising the steps of:

inserting the workpiece in a bonding apparatus which includes a tool having a tip with a conical cavity therein;

providing a predetermined quantity of material at said tip;

bringing said tip and said material into contact with the surface of said workpiece; and applying a source of vibrational energy to said tool to form and bond a portion of said material on to the face of the workpiece whereby said portion of said material is shaped into a conical projection of the same shape as the conical cavity in the tool without separating said portion from the remainder of said material.

2. The method as set forth in claim 1, wherein:

the vibration energy has a frequency range between 60 and 400,000 cycles per second.

3. The method as set forth in claim 1, wherein the vibrational energy is of the ultrasonic type.

4. A method of forming and attaching at least one projection to a surface of a workpiece comprising the steps of:

inserting the workpiece in a bonding apparatus which includes a tool having a tip with a conical cavity therein;

providing a predetermined quantity of material at said tip;

bringing said tip and said material into contact with the surface of said workpiece; and applying a source of heat energy to said tool to form and bond a portion of said material on to the face of the workpiece whereby said portion of said material is shaped into a conical projection of the same shape as the conical cavity in the tool without separating said portion from the remainder of said material.

5. The method as set forth in claim 1, wherein:

said material is at least one layer of metal foil;

the step of providing the predetermined quantity of said metal foil at the tip of the tool includes covering of said workpiece with said layer of metal foil; and the step of bringing the tip in contact with said metal foil further includes said tip making contact with said metal foil at a predetermined location of said workpiece.

6. A method of forming and attaching at least one projection to a surface of a semiconductor chip, comprising the steps of:

inserting the semiconductor chip in a bonding apparatus which includes a tool having a tip with a conical cavity therein;

providing a predetermined quantity of material at said tip;

bringing said tip and said material into contact with the surface of said semiconductor chip; and applying a source of vibrational energy to said tool to form and bond a portion of said material on the face of the semiconductor chip whereby said portion of said material is shaped into a conical projection of the same shape as the conical cavity in the tool without separating said portion from the remainder of said material.

7. The method as set forth in claim 6, wherein the vibrational energy is of the ultrasonic type.

8. The method as set forth in claim 6, wherein the vibrational energy has a frequency range between 60 and 400,000 cycles per second.

9. A method of forming and attaching at least one projection to a surface of a semiconductor chip, comprising the steps of:

inserting the semiconductor chip in a bonding apparatus which includes a tool having a tip with a conical cavity therein;

providing a predetermined quantity of material at said tip;

bringing said tip and said material into contact with the surface of said semiconductor chip; and applying a source of heat energy to said tool to form and bond a project of said material on the face of the semiconductor chip whereby said portion of said material is shaped into a conical projection of the same shape as the conical cavity in the tool without separating said portion from the remainder of said material.

10. The method as set forth in claim 6, wherein:

said material is at least one layer of metal foil;

the step of providing the predetermined quantity of said metal foil at the tip of the tool includes covering of said semiconductor chip with said layer of metal foil; and the step of bringing the tip in contact with said metal foil further includes said tip making contact with said metal foil at a predetermined location of said semiconductor chip.

11. A method of forming and attaching at least one projection to a surface of a substrate wafer, comprising the steps of:

inserting the substrate wafer in a bonding apparatus which includes a total having a tip with a conical cavity therein;

providing a predetermined quantity of material at said tip;

bringing said tip and said material into contact with the surface of said substrate wafer; and applying a source of vibrational energy to said tool to form and bond a project of said material on the face of the substrate wafer whereby said portion of said material is shaped into a conical projection of the same shape as the conical cavity in the tool without separating said portion from the remainder of said material.

12. The method as set forth in claim 11, wherein the vibrational energy has a frequency range between 60 and 400,000 cycles per second.

13. The method as set forth in claim 11, wherein the vibrational energy is of the ultrasonic type.

14. A method of forming and attaching at least one projection to a surface of a substrate wafer, comprising the steps of:

inserting the substrate wafer in a bonding apparatus which includes a tool having a tip with a conical cavity therein;

providing a predetermined quantity of material at said tip;

bringing said tip and said material into contact with the surface of said substrate wafer; and applying a source of heat energy to said tool to form and bond a project of said material on the face of the substrate wafer whereby said portion of said material is shaped into a conical projection of the same shape as the conical cavity in the tool without separating said portion from the remainder of said material.

15. The method as set forth in claim 11, wherein:

said material is at least one layer of metal foil;

the step of providing the predetermined quantity of said metal foil at the tip of the tool includes covering of said substrate wafer with said layer of metal foil; and the step of bringing the tip in contact with said metal foil further includes said tip making contact with said metal foil at a predetermined location of said substrate wafer.

References Cited

UNITED STATES PATENTS

| | | | |
|---|---|---|---|
| 2,703,997 | 3/1955 | Sowter | 29—475 XR |
| 2,882,588 | 4/1959 | Rieppel | 29—470.1 XR |
| 3,113,376 | 12/1963 | Pflumm et al. | 29—472.3 |
| 3,310,216 | 3/1967 | Kollner et al. | 228—5 |
| 3,319,984 | 5/1967 | Jones et al. | 228—1 |
| 3,330,026 | 7/1967 | Best et al. | 29—470.1 |
| 3,367,809 | 2/1968 | Soloff | 29—182 |
| 3,440,118 | 4/1969 | Obeda | 228—1 |

OTHER REFERENCES

IBM Technical Disclosure Bulletin, vol. 10, No. 12, May 1968.

JOHN E. CAMPBELL, Primary Examiner

R. B. LAZARUS, Assistant Examiner

U.S. Cl. X.R.

29—475; 228—1, 5

PO-1050
(5/69)

UNITED STATES PATENT OFFICE
CERTIFICATE OF CORRECTION

Patent No. 3,531,852 Dated October 22, 1970

Inventor(s) John W. Slemmons and Anthony J. Dominick, Jr.

It is certified that error appears in the above-identified patent and that said Letters Patent are hereby corrected as shown below:

Claim 2, Column 4, line 47, delete "vibration" substitute therefor --vibrational--

Claim 9, Column 5, line 36, delete "project" substitute therefor -- portion --

Claim 11, Column 5, line 56, delete "total" substitute therefor --tool--

Claim 11, Column 6, line 2, delete "project" substitute therefor --portion--

Claim 14, Column 6, line 24, delete "project" substitute therefor --projection--

SIGNED AND SEALED
DEC 15 1970

(SEAL)
Attest:

Edward M. Fletcher, Jr.
Attesting Officer

WILLIAM E. SCHUYLER, JR.
Commissioner of Patents